United States Patent [19]

Akagawa et al.

[11] Patent Number: 5,804,827
[45] Date of Patent: Sep. 8, 1998

[54] INFRARED RAY DETECTION DEVICE AND SOLID-STATE IMAGING APPARATUS

[75] Inventors: Keiichi Akagawa, Kamakura; Atsushi Komai, Tokorozawa, both of Japan

[73] Assignee: Nikon Corporation, Tokyo, Japan

[21] Appl. No.: 738,108

[22] Filed: Oct. 25, 1996

[30] Foreign Application Priority Data

Oct. 27, 1995 [JP] Japan ................................. 7-280191
Dec. 22, 1995 [JP] Japan ................................. 7-335275

[51] Int. Cl.⁶ ................... H01L 31/101; H01L 31/0232; G01J 5/20; G01T 1/20
[52] U.S. Cl. ........................... 250/370.06; 250/339.05; 250/370.14; 250/338.4; 250/368; 257/432; 257/435; 257/440; 257/434
[58] Field of Search ................... 257/432, 433, 434, 435, 440, 451, 455, 446; 250/370.06, 370.08, 338.4, 370.14, 339.02, 339.05, 368

[56] References Cited

U.S. PATENT DOCUMENTS

| | | | |
|---|---|---|---|
| 3,971,939 | 7/1976 | Andressen | 250/339.05 |
| 4,313,127 | 1/1982 | Su | 257/435 |
| 4,519,707 | 5/1985 | Kaffer | 250/339.05 |
| 5,122,669 | 6/1992 | Herring et al. | 250/370 |
| 5,581,085 | 12/1996 | Reffner | 250/339.05 |

FOREIGN PATENT DOCUMENTS

| | | | |
|---|---|---|---|
| 59-188966 | 10/1984 | Japan | 257/446 |
| 61-69170 | 4/1986 | Japan | 257/446 |
| 61-73369 | 4/1986 | Japan . | |

OTHER PUBLICATIONS

Chen et al., "Ultraviolet, Visible, and Infrared Response of PtSi Schottky–Barrier Detectors Operated in the Front–Illuminated Mode", IEEE Transactions on Electron Devices, vol. 38, No. 5, pp. 1094–1103, May 1991.

Primary Examiner—Jerome Jackson
Attorney, Agent, or Firm—Foley & Lardner

[57] ABSTRACT

An infrared ray detection device of this invention includes (i) a silicon substrate, (ii) a plurality of light-receiving portions which are disposed at predetermined intervals on one surface of the silicon substrate, and receive infrared rays, (iii) a plurality of reading portions which are disposed on the one surface of the silicon substrate at positions adjacent to the plurality of light-receiving portions, and read outputs from the plurality of light-receiving portions, and (iv) an impurity-doped silicon layer which are disposed in contact with the other surface of the silicon substrate and contains a donor or acceptor impurity at a concentration high enough to absorb infrared rays passing through the silicon substrate. Also, a solid-state imaging apparatus of this invention includes (1) a light detection device having detection sensitivity to light in a first wavelength region and light in a second wavelength region shorter than the first wavelength region, and (2) an adjustment mechanism which is disposed in front of the light detection device, consists of a member that transmits the light in the first wavelength region and shields the light in the second wavelength region, and adjusts the intensity of the light in the second wavelength region incident on the light detection device.

16 Claims, 7 Drawing Sheets

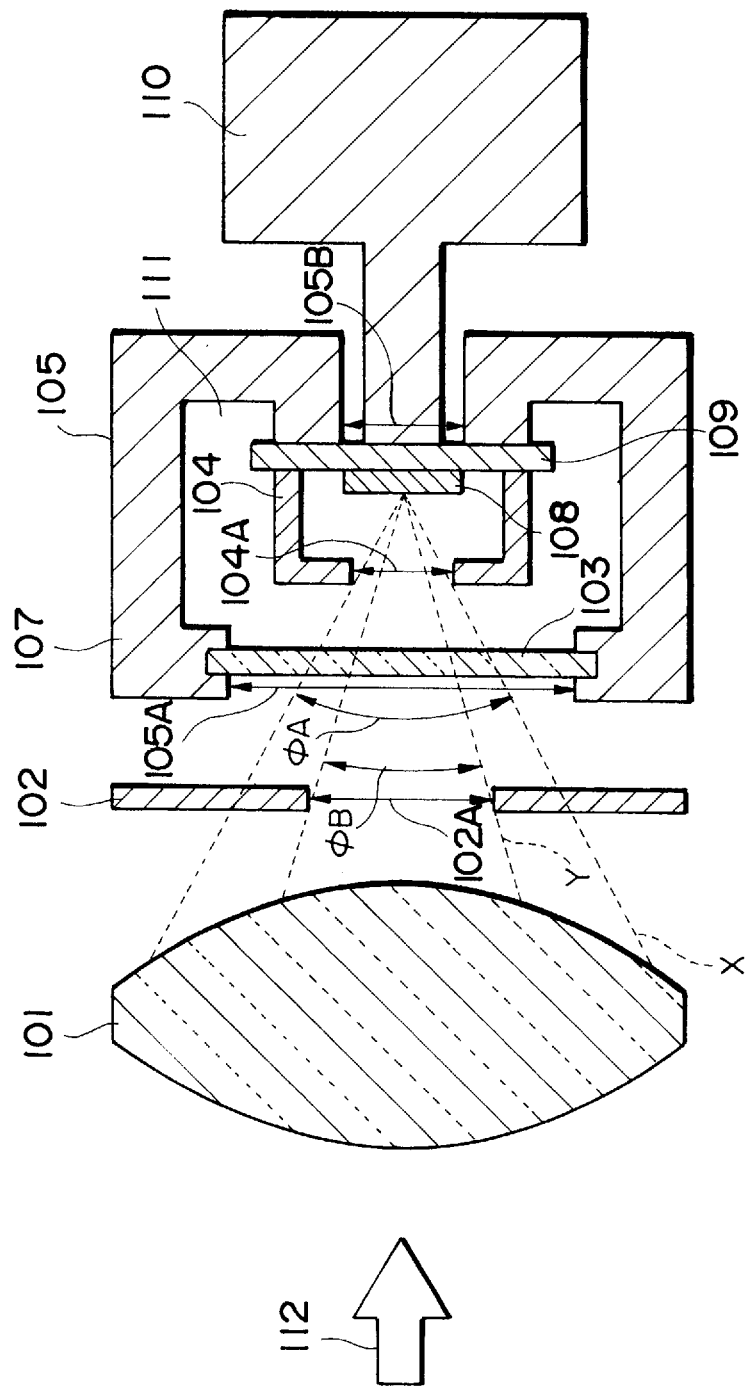

Fig. 5A

| OPTICAL MATERIAL | TRANSPARENT REGION [μm] |
|---|---|
| LiF | 0.11 ~ 9.0 |
| NaF | 0.19 ~ 15.0 |
| NaCl | 0.21 ~ 26.0 |
| KCl | 0.21 ~ 30.0 |
| KBr | 0.23 ~ 40.0 |
| K | 0.25 ~ 42.0 |
| CsBr | 0.22 ~ 55.0 |
| CsI | 0.24 ~ 70.0 |
| TlCl | 0.44 ~ 34.0 |
| KRS-5 | 0.5 ~ 40.0 |
| AgCl | 0.4 ~ 30.0 |

ALKALI METAL HALIDE ETC.

Fig. 5B

| OPTICAL MATERIAL | TRANSPARENT REGION [μm] |
|---|---|
| $CaF_2$ | 0.1 ~ 12 |
| $SrF_2$ | 0.3 ~ 11 |
| $BaF_2$ | 0.3 ~ 15 |
| $MgF_2$ | 0.12 ~ 9.0 |
| $PbF_2$ | 11.6 (10 μm) |

ALKALINE-EARTH METAL FLUORIDE ETC.

Fig. 6A

| OPTICAL MATERIAL | TRANSPARENT REGION [μm] |
|---|---|
| DIAMOND | 0.25 ~ 80 |
| Ge | 1.8 ~ 23 |
| Si | 1.2 ~ 15 |
| GaAs | 0.9 ~ 18 |
| ZnS | 0.4 ~ 12 |
| ZnSe | 0.5 ~ 22 |
| CdTe | 0.9 ~ 30 |

SEMICONDUCTOR

Fig. 6B

| OPTICAL MATERIAL | TRANSPARENT REGION [μm] |
|---|---|
| $As_2S_3$ | 1 ~ 11 |
| $As_{10}Se_{90}$ | 1 ~ 19 |
| $Ge_{33}As_{12}S_{55}$ | 0.8 ~ 16 |
| $Ge_{10}As_{20}Te_{70}$ | 2 ~ 20 |
| $Ge_{28}Sb_{12}Se_{60}$ | 1 ~ 14 |

CHALCOGENIDE GLASS

INFRARED RAY DETECTION DEVICE AND SOLID-STATE IMAGING APPARATUS

BACKGROUND OF THE INVENTION

1. Field of the Invention

The present invention relates to an infrared ray detection device used in a solid-state imaging device for obtaining an infrared ray image, and a solid-state imaging apparatus which can simultaneously obtain both an infrared ray image and visible light ray image.

2. Related Background Art

As a conventional infrared ray detection device for detecting infrared rays, a device disclosed in, e.g., "Japanese Patent Laid-Open No. 61-73369", is known. In this infrared ray detection device, a plurality of light-receiving portions that receive infrared rays are disposed at predetermined intervals on one surface of a silicon substrate. A plurality of reading portions disposed adjacent to these light-receiving portions read the outputs from the light-receiving portions.

In such device, for example, when infrared rays are obliquely incident on a predetermined light-receiving portion, infrared rays that cannot be absorbed by the light-receiving portion reach the other surface of the silicon substrate which has no absorption performance of infrared rays, and are reflected by the other surface. When these reflected rays are incident on another light-receiving portion other than the light-receiving portion through which the infrared rays have passed, crosstalk that generates an extraneous signal in this light-receiving portion occurs, and may cause deterioration of the obtained image.

In order to eliminate this crosstalk, a black-body paint layer consisting of a black-body paint is applied on the other surface of the silicon substrate in the conventional device. With this arrangement, infrared rays that have reached the other surface of the silicon substrate are absorbed by the black-body paint layer, thus preventing generation of reflected rays. Note that the above-mentioned infrared ray detection device is normally used in a vacuum atmosphere due to the necessity for, e.g., cooling.

As one of conventional solid-state imaging apparatuses, a solid-state imaging apparatus which uses an infrared ray image sensor for detecting infrared rays is known. A photon type infrared ray image sensor has high sensitivity and high response speed, i.e., has good response characteristics. However, in order to detect infrared rays in a long wavelength band, the light-receiving portions of the device must be cooled due to the wavelength dependence of the detection sensitivity.

For example, an infrared ray image sensor which has PtSi Schottky-barrier diodes as light-receiving portions (sensor portions) cooled to a temperature of 77 K has been developed for the purpose of detecting infrared rays (middle infrared rays) having wavelengths of about 3 $\mu$m to 5 $\mu$m. The PtSi Schottky-barrier diode has spectral sensitivity characteristics not only for middle infrared rays having wavelengths of about 3 $\mu$m to 5 $\mu$m but also for ultraviolet rays having wavelengths of about 0.2 $\mu$m to 0.4 $\mu$m, visible light rays having wavelengths of about 0.4 $\mu$m to 0.7 $\mu$m, and near infrared rays having wavelengths of about 0.7 $\mu$m to 3 $\mu$m, as disclosed in Chenson K. Chen, Bettina Nechay, and Bor-Yeu Tsaur, "Ultraviolet, Visible, and Infrared Response of PtSi Schottky-Barrier Detectors Operated in the Front-Illuminated Mode", IEEE TRANSACTIONS ON ELECTRON DEVICES, Vol. 38, No. 5, May 1991.

Also, an example of a wide-band infrared ray image sensor using PtSi Schottky-barrier diodes and having a broad wavelength band is disclosed in U.S. Pat. [19] No. 5,122,699. By utilizing the characteristics of such PtSi Schottky-barrier diode, a solid-state imaging apparatus using an infrared ray image sensor can obtain a visible light ray image.

More specifically, when a focusing lens is disposed as an optical system consisting of a member that transmits visible light rays in place of an infrared ray lens consisting of silicon or germanium, a visible light ray image can be formed on an image sensor having PtSi Schottky-barrier diodes. Since this image sensor has detection sensitivity with respect to visible light ray, the formed visible light ray image is photoelectrically converted into an electrical signal, which is output to an external circuit.

SUMMARY OF THE INVENTION

It is the first object of the present invention to provide an infrared ray detection device which can improve image quality while suppressing deterioration of the obtained image by preventing outgassing while reliably absorbing infrared rays incident on a silicon substrate.

It is the second object of the present invention to provide a solid-state imaging apparatus which can simultaneously and accurately obtain both an infrared ray image and a visible light ray image without exchanging the focusing lens and without any influence of infrared rays radiated from a stop (diaphragm).

In order to achieve the above-mentioned first object, an infrared ray detection device of the present invention comprises (i) a silicon substrate, (ii) a plurality of light-receiving portions which are disposed at predetermined intervals on one surface of the silicon substrate, and receive infrared rays, (iii) a plurality of reading portions which are disposed on the one surface of the silicon substrate at positions adjacent to the plurality of light-receiving portions, and read outputs from the plurality of light-receiving portions, and (iv) an impurity-doped silicon layer which are disposed in contact with the other surface opposing the one surface of the silicon substrate and contains a donor or acceptor impurity at a concentration high enough to absorb infrared rays passing through the silicon substrate.

In such infrared ray detection device, infrared rays that are not absorbed by one light-receiving portion pass through the silicon substrate, and are absorbed by the impurity-doped silicon layer which is disposed in contact with the other surface of the silicon substrate and contains the donor impurity or acceptor impurity at a high concentration. Since no solvent or the like remains in the impurity-doped silicon layer, the layer never undergoes aging that decreases the degree of vacuum around the device.

In the infrared ray detection device of the present invention, the plurality of light-receiving portions are preferably constituted by a metal silicide film which is in Schottky-contact with the one surface of the silicon substrate. In this case, the plurality of light-receiving portions can easily detect externally incident infrared rays.

In the infrared ray detection device of the present invention, the impurity-doped silicon layer preferably has an impurity concentration of not less than $5 \times 10^{20}$ cm$^{-3}$. In this case, the impurity-doped silicon layer can sufficiently absorb infrared rays incident on the silicon substrate.

In the infrared ray detection device of the present invention, the impurity-doped silicon layer preferably comprises an impurity-diffused silicon layer formed by diffusing the donor or acceptor impurity from the other surface of the silicon substrate. In this case, the impurity-doped silicon layer can be easily and reliably formed.

In the infrared ray detection device of the present invention, the impurity-doped silicon layer preferably comprises a polycrystalline silicon layer which is grown on the other surface of the silicon substrate and contains the donor or acceptor impurity. In this case, the impurity-doped silicon layer can be easily and reliably formed.

Furthermore, in the infrared ray detection device of the present invention, the impurity-doped silicon layer preferably comprises an impurity-diffused silicon layer formed by diffusing the donor or acceptor impurity from the other surface of the silicon substrate and a polycrystalline silicon layer which is grown on the other surface of the silicon substrate and contains the donor or acceptor impurity. In this case, infrared rays which are incident on the silicon substrate are absorbed by the impurity-diffused silicon layer, and infrared rays that are not absorbed by the impurity-diffused silicon layer and pass therethrough are absorbed by the polycrystalline silicon layer.

In order to achieve the above-mentioned second object, a solid-state imaging apparatus of the present invention comprises (1) a light detection device having detection sensitivity to light in a first wavelength region and light in a second wavelength region shorter than the first wavelength region, and (2) an adjustment mechanism which is disposed in front of the light detection device, consists of a member that transmits the light in the first wavelength region and shields the light in the second wavelength region, and adjusts an intensity of the light in the second wavelength region incident on the light detection device.

In such solid-state imaging apparatus, since the adjustment mechanism is disposed in front of the light detection device, the intensity of light in the second wavelength range, which is incident on the light detection device, can be adjusted. For this reason, the light detection device can simultaneously and accurately detect light components in the first and second wavelength ranges. Since the adjustment mechanism comprises a member that transmits infrared rays and shields visible light rays, it does not radiate any infrared rays by itself even if it is not subjected to a cooling treatment.

In the solid-state imaging apparatus of the present invention, the adjustment mechanism preferably comprises a stop which variably sets a size of an aperture portion for transmitting light components in the first and second wavelength regions. In this case, the intensity of light in the second wavelength range, which is incident on the light detection device, can be easily adjusted.

The solid-state imaging apparatus of the present invention preferably further comprises an aperture limiting mechanism which is arranged between the adjustment mechanism and the light detection device and limits incidence of the light in the first wavelength region with respect to the light detection device. In this case, since the aperture limiting mechanism limits the direction of incidence of light in the second wavelength range with respect to the light detection device, only desired light components in the second wavelength range can be caused to be incident on the light detection device.

Note that the aperture limiting mechanism preferably comprises a shield which consists of a member for shielding light components in the first and second wavelength regions, and has an aperture portion for transmitting the light components in the first and second wavelength regions. In this case, the direction of incidence of light in the first wavelength range with respect to the light detection device can be easily limited.

The solid-state imaging apparatus of the present invention preferably further comprises a focusing optical system for focusing light components in the first and second wavelength regions and guiding the focused light components toward the light detection device. In this case, the focusing optical system can image light components in the first and second wavelength ranges on the light-receiving surface of the light detection device.

Note that the focusing optical system preferably comprises a lens which is arranged in front of the adjustment mechanism and transmits and focuses the light components in the first and second wavelength regions. In this case, light components in the first and second wavelength ranges can be easily imaged by the focusing optical system on the light-receiving surface of the light detection device.

The focusing optical system preferably comprises a mirror which is arranged between the adjustment mechanism and the light detection device, and reflects and focuses the light components in the first and second wavelength regions. In this case, light components in the first and second wavelength ranges can be easily imaged by the focusing optical system on the light-receiving surface of the light detection device.

The solid-state imaging apparatus of the present invention preferably further comprises a wavelength limiting mechanism which is arranged in front of the light detection device, and transmits light in a predetermined wavelength region in the first wavelength region which is in correspondence with light absorption characteristics of an object to be measured, and light in at least a partial wavelength region in the second wavelength region. In this case, the light detection device can measure the distribution of the object to be measured, which absorbs light components in a predetermined wavelength range in the first wavelength range, and shields light components in at least a partial wavelength range in the second wavelength range.

Furthermore, in the solid-state imaging apparatus of the present invention, preferably, the light in the first wavelength region is infrared rays, and the light in the second wavelength region is visible light rays. In this case, the light detection device can simultaneously and accurately detect both an infrared ray image and a visible light ray image.

The light detection device more preferably comprises (i) a silicon substrate, (ii) a plurality of light-receiving portions which are disposed at predetermined intervals on one surface of the silicon substrate, and receive infrared rays, (iii) a plurality of reading portions which are disposed on the one surface of the silicon substrate at positions adjacent to the plurality of light-receiving portions, and read outputs from the plurality of light-receiving portions, and (iv) an impurity-doped silicon layer which are disposed in contact with the other surface opposing the one surface of the silicon substrate and contains a donor or acceptor impurity at a concentration high enough to absorb infrared rays passing through the silicon substrate.

In such solid-state imaging apparatus, infrared rays that are not absorbed by the light-receiving portion pass through the silicon substrate, and are absorbed by the impurity-doped silicon layer which is disposed on the other surface of the silicon substrate and contains the donor or acceptor impurity at a high concentration. Since no solvent or the like remains in the impurity-doped silicon layer, the layer never undergoes aging that decreases the degree of vacuum around the device.

Note that the plurality of light-receiving portions are preferably constituted by a metal silicide film which is in Schottky-contact with the one surface of the silicon substrate. In this case, the plurality of light-receiving portions can easily detect externally incident infrared rays.

The impurity-doped silicon layer preferably has an impurity concentration of not less than $5 \times 10^{20}$ cm$^{-3}$. In this case, the impurity-doped silicon layer can sufficiently absorb infrared rays incident on the silicon substrate.

The impurity-doped silicon layer preferably comprises an impurity-diffused silicon layer formed by diffusing the donor or acceptor impurity from the other surface of the silicon substrate. In this case, the impurity-doped silicon layer can be easily and reliably formed.

The impurity-doped silicon layer preferably comprises a polycrystalline silicon layer which is grown on the other surface of the silicon substrate and contains the donor or acceptor impurity. In this case, the impurity-doped silicon layer can be easily and reliably formed.

Furthermore, the impurity-doped silicon layer preferably comprises an impurity-diffused silicon layer formed by diffusing the donor or acceptor impurity from the other surface of the silicon substrate and a polycrystalline silicon layer which is grown on the other surface of the silicon substrate and contains the donor or acceptor impurity. In this case, infrared rays which are incident on the silicon substrate are absorbed by the impurity-diffused silicon layer, and infrared rays that are not absorbed by the impurity-diffused silicon layer and pass therethrough are absorbed by the polycrystalline silicon layer.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 4 is a sectional view showing the arrangement of a solid-state imaging apparatus according to the fourth embodiment of the present invention;

FIG. 5A is a table showing the transparent wavelength ranges of optical materials consisting of alkali metal halides and the like;

FIG. 5B is a table showing the transparent wavelength ranges of optical materials consisting of alkaline-earth metal fluorides and the like;

FIG. 6A is a table showing the transparent wavelength range of optical materials consisting of semiconductors and the like;

FIG. 6B is a table showing the transparent wavelength range of optical materials consisting of chalcogenide glass and the like;

DETAILED DESCRIPTION OF THE PREFERRED EMBODIMENTS

Figure 1:
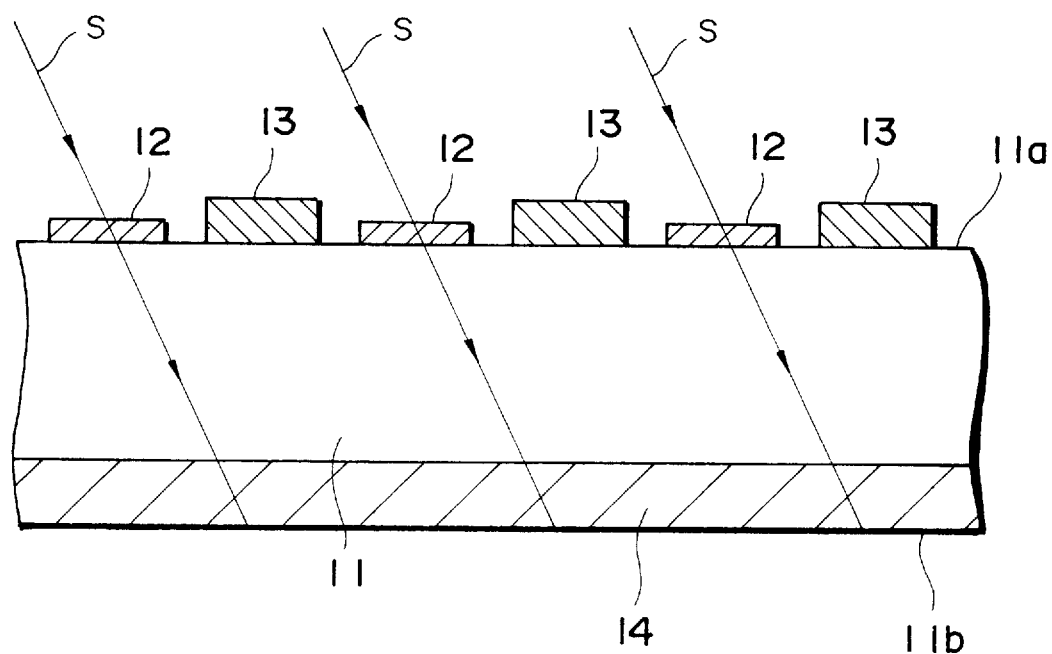
FIG. 1 is a sectional view showing the arrangement of an infrared ray detection device according to the first embodiment of the present invention.

The arrangements and operations of preferred embodiments of an infrared ray detection device and a solid-state imaging apparatus according to the present invention will be described in detail hereinafter with reference to FIGS. 1 to 8. Note that the same reference numerals denote the same parts throughout descriptions of the drawings, and a repetitive description thereof will be avoided. Also, the dimensional ratios of the drawings do not always match those of the described ones.

First Embodiment

An infrared ray detection device of this embodiment has an arrangement, as shown in FIG. 1. More specifically, a plurality of light-receiving portions 12 for receiving infrared rays S are disposed at predetermined intervals on one surface (front surface) 11a of a silicon substrate 11. Each of the light-receiving portions 12 is obtaining by forming a metal silicide film of, e.g., platinum silicide, palladium silicide, or the like to have a Schottky contact with the silicon substrate 11.

A plurality of reading portions 13 for reading the outputs from the plurality of light-receiving portions 12 are disposed on the one surface 11a of the silicon substrate 11 at positions adjacent to the light-receiving portions 12. These reading portions 13 are formed as the transfer electrodes of a CCD when the device is, e.g., of CCD (Charge Coupled Device) type, or as the gate electrodes of MOS transistors when the device is of MOS (Metal-Oxide-Silicon) type.

Furthermore, an impurity-diffused silicon layer 14 is formed as an impurity-doped silicon layer on the other surface (rear surface) 11b of the silicon substrate 11 to contain a donor impurity such as P, As, Sb, or the like at a high concentration. The impurity-diffused layer 14 preferably has a donor impurity concentration of $5 \times 10^{20}$ cm$^{-3}$ or higher.

The impurity-diffused silicon layer 14 is formed by diffusion of the above-mentioned donor impurity into an internal region in the vicinity of the other surface 11b of the silicon substrate 11. A treatment of diffusing such impurity is attained using a known thermal diffusion method, an ion-implantation method, or the like. The treatment of diffusing a donor impurity is preferably performed before the light-receiving portions 12 and the reading portions 13 are formed on the silicon substrate 11, although it may be performed in any process as long as the manufacture of the light-receiving portions 12 and the reading portions 13 is not influenced.

Note that the infrared ray absorption performance of the impurity-diffused silicon layer 14 increases as the donor impurity concentration becomes higher by the treatment of diffusing a donor impurity and as the diffusion depth of the donor impurity used increases. However, it is sufficiently effective when the donor impurity concentration is set to be the above-mentioned value, i.e., about $5 \times 10^{20}$ cm$^{-3}$ or higher. At this time, it is sufficiently effective when the diffusion depth of the donor impurity is about 1 μm to 5 μm.

More specifically, if no impurity-doped silicon layer is formed on the silicon substrate, when infrared rays having an intensity $I_0$ entering the silicon substrate via the light-receiving portion reach the rear surface of the silicon substrate, component light having an intensity of about 30% is reflected by the interface between the silicon substrate and the exterior of the device, and component light having an intensity of about 70% passes through the silicon substrate and is emitted outside.

On the other hand, when the impurity-doped silicon layer is formed on the silicon substrate, component light, reflected by the rear surface of the silicon substrate, of infrared rays entering the silicon substrate via the light-receiving portion passes through the impurity-doped silicon layer having a layer thickness x and a light absorption coefficient α twice. For this reason, the intensity, $I_1$, of infrared rays that propagate toward the light-receiving portion again can be expressed by:

$$I_1 = 0.3 I_0 \times e^{-\alpha x} \times e^{-\alpha x}$$
$$= 0.3 I_0 e^{-2\alpha x}$$

If the layer thickness x of the impurity-doped silicon layer is assumed to be 1 μm to 5 μm, the light absorption coefficient α of the impurity-doped silicon layer is determined to be 694 cm$^{-1}$ to 3,740 cm$^{-1}$.

Referring to FIGS. 9-6 (p. 190) and 9-7 (p. 191) in W. R. Runyan, "Silicon Semiconductor Technology", McGRAW-HILL BOOK COMPANY in association with the value of the light absorption coefficient α of the impurity-doped silicon layer, it is presumed that the resistivity, ρ, of n-type silicon and p-type silicon required for absorbing light having a wavelength of, e.g., 4 μm, is about 0.001 Ωcm or less.

Furthermore, referring to FIG. 22 (p. 43), S. M. SZE, "Physics of Semiconductor Devices", A Division of John Wiley & Sons in association with the value of the resistivity ρ of n-type silicon and p-type silicon, it is evident that n-type silicon and p-type silicon is required to have a donor impurity concentration and acceptor impurity concentration of $10^{20}$ cm$^3$ or higher.

In the infrared ray detection device with the above arrangement, infrared rays that are incident from the one surface 11a side of the silicon substrate 11 and are not absorbed by the light-receiving portions 12 pass through the silicon substrate 11, and are then absorbed by the impurity-diffused silicon layer 14 disposed on the other surface 11b of the silicon substrate 11, as indicated by arrows S in FIG. 1. For this reason, crosstalk can be prevented.

More specifically, in the above-mentioned infrared ray detection device, since the impurity-diffused silicon layer 14 is formed by diffusing a donor impurity in the other surface 11b of the silicon substrate 11, the impurity-diffused silicon layer 14 can be easily and reliably formed. On the other hand, since the impurity-diffused silicon layer 14 is set to have a concentration as high as $5 \times 10^{20}$ cm$^{-3}$ or higher, the layer 14 can sufficiently absorb infrared rays.

Furthermore, since the refractive index of the impurity-diffused silicon layer 14 is roughly equal to that of the silicon substrate 11, reflection hardly occurs at the interface between the silicon substrate 11 and the impurity-diffused silicon layer 14, and hence, infrared rays entering the silicon substrate 11 can be absorbed more reliably.

Since no solvent or the like remains in the impurity-diffused silicon layer 14 formed as an infrared ray absorption layer by containing a donor impurity, unlike in an infrared ray absorption layer consisting of, e.g., a black-body paint, the layer 14 never causes so-called outgassing even when the infrared ray detection device is used in a vacuum for a long period of time, and hence, can prevent a decrease in degree of vacuum.

Therefore, since the impurity-diffused silicon layer 14 which has high infrared ray absorption performance since it contains a donor impurity at a high concentration is disposed on the other surface 11b side of the silicon substrate 11, infrared rays entering the silicon substrate 11 can be reliably absorbed, and image quality can be improved by suppressing deterioration of the obtained image.

Second Embodiment

Figure 2:
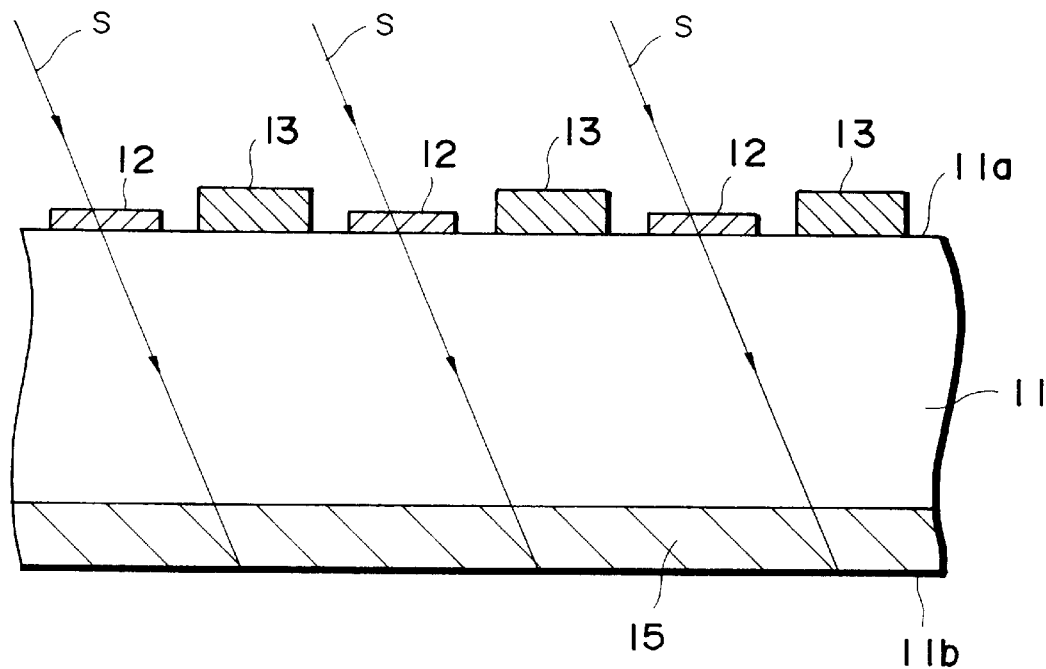
FIG. 2 is a sectional view showing the arrangement of an infrared ray detection device according to the second embodiment of the present invention.

An infrared ray detection device of this embodiment has an arrangement, as shown in FIG. 2. More specifically, a polycrystalline silicon (poly-Si) layer 15 serving as an impurity-doped silicon layer is grown on the other surface 11b of the silicon substrate 11 while containing a donor impurity such as P, As, Sb, or the like at a high concentration. Note that other portions are the same as those in the first embodiment, and a detailed description thereof will be omitted.

The polycrystalline silicon layer 15 is formed by growing a silicon film on the other surface 11b of the silicon substrate 11 by, e.g., a CVD (Chemical Vapor Deposition) method, and thereafter, thermally diffusing or ion-implanting the above-mentioned donor impurity into the silicon film. Alternatively, the polycrystalline silicon layer 15 is formed by mixing a donor impurity into a source gas upon forming the silicon film on the other surface 11b of the silicon substrate 11.

Note that the infrared ray absorption performance of the polycrystalline silicon layer 15 increases as the concentration of the donor impurity becomes higher and as the layer thickness becomes larger. However, it is sufficiently effective when the donor impurity concentration is set to be about $5 \times 10^{20}$ cm$^{-3}$ or higher, and the layer thickness is set to be about 0.5 μm to 5 μm.

In the above-mentioned infrared ray detection device, since the polycrystalline silicon layer 15 containing a donor impurity is grown on the other surface 11b of the silicon substrate 11, the polycrystalline silicon layer 15 can be easily and reliably formed.

Therefore, since the polycrystalline silicon layer 15 which has high infrared ray absorption performance since it contains a donor impurity at a high concentration is disposed on the other surface 11b side of the silicon substrate 11, infrared rays entering the silicon substrate 11 can be reliably absorbed, and image quality can be improved by suppressing deterioration of the obtained image.

Since the polycrystalline silicon layer 15 is formed by the CVD method, it can be formed at the same time when, for example, the reading portions 13 are formed by the CVD method. When a reduced-pressure CVD device is used, since polycrystalline silicon layers are simultaneously formed on one surface 11a and the other surface 11b of the silicon substrate 11, the impurity-doped silicon layer can be formed without changing the manufacturing process.

Third Embodiment

Figure 3:
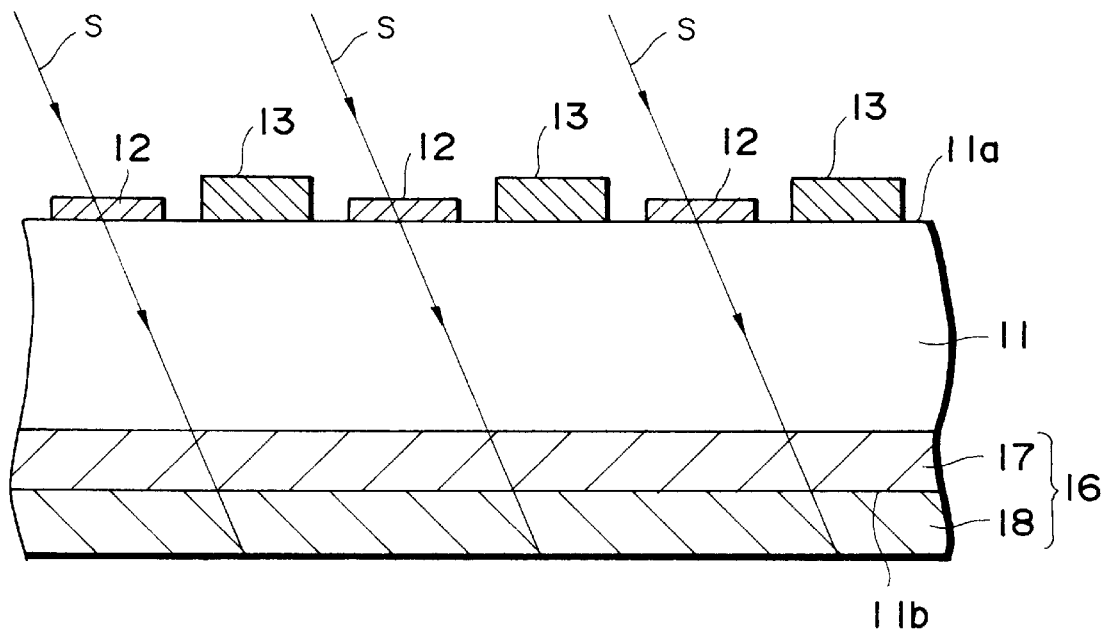
FIG. 3 is a sectional view showing the arrangement of an infrared ray detection device according to the third embodiment of the present invention.

An infrared ray detection device of this embodiment has an arrangement, as shown in FIG. 3. More specifically, an impurity-doped silicon layer 16 is constituted by an impurity-diffused silicon layer 17 formed by diffusing a donor impurity from the other surface 11b of the silicon substrate, and a polycrystalline silicon layer 18 which is grown on the other surface 11b of the silicon substrate 11 and contains a donor impurity. Note that other portions are the same as those in the first embodiment, and a detailed description thereof will be omitted.

The impurity-doped silicon layer 16 is formed by forming the impurity-diffused silicon layer 17 on the inner side of the other surface 11b of the silicon layer in the same manner as the impurity-diffused silicon layer 14 in the first embodiment, and forming the polycrystalline silicon layer 18 on the outer side of the impurity-diffused silicon layer 17 in the same manner as the polycrystalline silicon layer 15 in the second embodiment.

In the infrared ray detection device with the above arrangement, infrared rays that enter the silicon substrate 11 from the one surface 11a side of the silicon substrate 11 are absorbed by the impurity-diffused silicon layer 17, as indicated by arrows S in FIG. 3. Infrared rays that are not absorbed by the impurity-diffused silicon layer 17 but pass therethrough are absorbed by the polycrystalline silicon layer 18. For this reason, crosstalk can be prevented more effectively.

In the above-mentioned infrared ray detection device, since the impurity-doped silicon layer 16 is constituted by the impurity-diffused silicon layer 17 which is formed by diffusing a donor impurity from the other surface 11b of the silicon substrate 11, and the polycrystalline silicon layer 18 which is grown on the other surface 11b of the silicon substrate 11 and contains a donor impurity, infrared rays entering the silicon substrate 11 can be absorbed more effectively.

Therefore, since the impurity-doped silicon layer 16 which has high infrared ray absorption performance since it contains a donor impurity at a high concentration is disposed on the inner and outer sides of the other surface 11b of the silicon substrate 11, infrared rays that enter the silicon substrate 11 can be reliably absorbed, and image quality can be improved by suppressing deterioration of the obtained image.

Fourth Embodiment

A solid-state imaging apparatus of this embodiment has an arrangement, as shown in FIG. 4. More specifically, the solid-state imaging apparatus comprises a focusing lens (focusing optical system) 101 which consists of a member such as ZnS or the like, and transmits and focuses both infrared rays (light in the first wavelength range) and visible light rays (light in the second wavelength range) of light rays 112 incident from the left side in FIG. 4, a light-receiving device 107 for receiving the infrared rays and visible light rays focused by the focusing lens 101, and a stirring cooler 110 for cooling an image sensor (light detection device) 108 arranged inside the light-receiving device 107.

Furthermore, a variable stop (adjustment mechanism) 102 consisting of a member such as Si or the like, that transmits infrared rays and shields visible light rays, is disposed between the focusing lens 101 and the light-receiving device 107. A nearly circular aperture portion 102A, the size of which is adjustable, is arranged at the central portion of the variable stop 102. For this reason, the variable stop 102 can adjust the angle of incidence of visible light rays transmitted through the focusing lens 101 with respect to the image sensor 108.

The interior of the light-receiving device 107 is surrounded by a hollow cylindrical dewer 105 consisting of a member having good heat insulation and light shielding properties. A circular aperture portion 105A is formed on the left side in FIG. 4 of the dewer 105, i.e., on the side opposing the focusing lens 101, so as to guide infrared rays and visible light rays passing through the variable stop 102 into the light-receiving device 107. In addition, a disk-shaped window 103 consisting of a member such as ZnS or the like, that transmits both infrared rays and visible light rays, is attached close to the dewer 105 to cover the entire surface of the aperture portion 105A.

Also, an aperture portion 105B is formed on the right side in FIG. 4 of the dewer 105, i.e., on the side opposing the aperture portion 105A, so as to cause the stirring cooler 110 to cool the interior of the dewer 105. Also, a flat cold stage (aperture limiting mechanism) 109 consisting of a member having good heat conductivity and light shielding property is attached close to the dewer 105 to cover the entire surface of the aperture portion 105B. In this manner, the interior of the light-receiving device 107 is sealed by the dewer 105, the window 103, and the cold stage 109.

On the cold stage 109 inside the dewer 105, the photon type image sensor 108 which has light-receiving portions consisting of PtSi Schottky-barrier diodes is attached. The image sensor 108 is disposed, so that infrared rays (infrared ray image) and visible light rays (visible light ray image) focused by the focusing lens 101 are imaged on the light-receiving portions of the image sensor 108.

Also, on the cold stage 109, a hollow cylindrical cold shield 104 consisting of a member such as Al or the like that has good heat conductivity and can shield both infrared rays and visible light rays is attached to surround the image sensor 108. On the left side in FIG. 4 of the cold shield 104, i.e., on the side opposing the variable stop 102, a circular aperture portion 104A is formed to guide infrared rays and visible light rays that pass through the window 103 toward the image sensor 108.

Note that the size of the aperture portion 104A of the cold shield 104 is determined to limit incidence of infrared rays entering the dewer 105 and incidence of infrared rays radiated from the dewer 105, i.e., incidence of infrared rays onto the image sensor 108. For this reason, infrared rays are imaged on the image sensor 108 as a light beam having an angle $\phi_A$ by the focusing lens 101 and the cold shield 104. That is, the cold shield 104 serves as a stop for infrared rays.

On the other hand, the size of the aperture portion 102A of the variable stop 102 is determined to limit incidence of visible light rays passing through the focusing lens 101 into the dewer 105, i.e., incidence of visible light rays onto the image sensor 108. For this reason, visible light rays are imaged on the image sensor 108 as a light beam having an angle $\phi_B$ ($\phi_B<\phi_A$) by the focusing lens 101 and the variable stop 102. More specifically, the variable stop 102 serves as a stop for only visible light rays.

The distal end of the stirring cooler 110 is connected to the cold stage 109 attached to the entire surface of the aperture portion 105A of the dewer 105. For this reason, the image sensor 108 and the cold shield 104 attached to the cold stage 109 are cooled by the stirring cooler 110 to a predetermined temperature of about 77 K.

Note that the interior of the light-receiving device 107, i.e., a space 111 defined by the dewer 105, the window 103, and the cold stage 109 is set in a vacuum state by an evacuation process so as to suppress condensation of the image sensor 108 and to maintain a constant ambient temperature of the image sensor 108. The degree of vacuum of this space 111 is preferably set to be about $10^{-3}$ Torr or less. The evacuation process of the space 111 may be performed in only the manufacture of the devices or upon using the device.

Referring to Society of Study for Infrared Techniques ed., "Infrared Optics", Ohm-sha, FIGS. 5A to 6B show the transparent wavelength regions of optical materials such as alkali metal halides, alkaline-earth metal fluorides, semiconductors, chalcogenide glass, and the like. In this embodiment, as the members of the focusing lens 101 and the window 103, ZnS (FIG. 6A) that transmits infrared rays in the wavelength range from about 3 μm to 5 μm and visible light rays in the wavelength range from about 0.4 μm to 0.7 μm is used.

In addition, as the members of the focusing lens 101 and the window 103, alkali-metal-halide-based optical materials shown in FIG. 5A, alkaline-earth metal fluoride-based optical materials shown in FIG. 5B, or semiconductors such as diamond and ZnSe shown in FIG. 6A may be used. These optical materials transmit both infrared rays and visible light rays.

In this embodiment, as the member of the variable stop 102, Si (FIG. 6A) that transmits infrared rays in the wavelength range from about 3 μm to 5 μm but shields visible light rays in the wavelength range from about 0.4 μm to 0.7 μm is used. In addition, as the member of the variable stop 102, semiconductors such as Ge, GaAs and CdTe shown in FIG. 6A and chalcogenide glass-based optical materials shown in FIG. 6B may be used. These materials transmit infrared rays and shield visible light rays.

The image sensor 108 preferably comprises a photon type image sensor, the light-receiving portions (sensor portions) of which are constituted by PtSi Schottky-barrier diodes as in the infrared ray detection devices of the first to third embodiments. This is because the PtSi Schottky-barrier diode has spectral sensitivity characteristics respectively for ultraviolet rays in the wavelength range from about 0.2 μm to 0.4 μm, visible light rays in the wavelength range from about 0.4 μm to 0.7 μm, near infrared rays in the wavelength range from about 0.7 μm to 3 μm, middle infrared rays in the wavelength range from about 3 μm to 5 μm, and the like.

The operation of the solid-state imaging apparatus of this embodiment will be described below.

The focusing lens 101 selectively transmits and focuses infrared rays and visible light rays included in light rays 112 incident from the left side in FIG. 4. Infrared rays X focused at the angle $\phi_A$ by the focusing lens 101 pass through the aperture portion 102A of the variable stop 102, and are also transmitted through a portion, other than the aperture portion 102A, of the variable stop 102. Then, the infrared rays X are guided to the light-receiving device 107. On the other hand, visible light rays Y focused by the focusing lens 101 pass through the aperture portion 102A of the variable stop 102, but are shielded by the portion, other than the aperture portion 102A, of the variable stop 102. More specifically, visible light rays Y further focused by the variable stop 102 at the angle $\phi_B$ are guided toward the light-receiving device 107.

Note that the size of the aperture portion 102A of the variable stop 102 is adjusted in correspondence with the brightness of visible light rays, that varies between the outdoors and indoors in the daytime as an ambient condition, i.e., the intensity of visible light rays incident on the image sensor 108. For this reason, light incident on the image sensor 108 can be adjusted so as to prevent the light-receiving portions of the image sensor 108 from being saturated by visible light ray components, i.e., to obtain an image with an appropriate exposure.

The infrared rays X and the visible light rays Y respectively focused at the angles $\phi_A$ and $\phi_B$ by the focusing lens 101 and the variable stop 102 pass through the window 103 and enter the light-receiving device 107. The infrared rays X and the visible light rays Y entering the light-receiving device 107 pass through the aperture portion 104A of the cold shield 104, and form images on the light-receiving portions of the image sensor 108. Since the variable stop 102 itself consisting of Si or the like does not radiate any infrared rays, unwanted infrared rays hardly enter the light-receiving device 107.

In general, since a substance radiates infrared rays in correspondence with its temperature, i.e., radiates more infrared rays as its temperature is higher, for example, the dewer 105 or the like radiates infrared rays. However, since the cold shield 104 is directly attached to the cold stage 109 and is cooled to a low temperature by the stirring cooler 110, it radiates few infrared rays. The aperture portion 104A of the cold shield 104 limits incidence of infrared rays other than those focused at the angle $\phi_A$ by the focusing lens 101 onto the image sensor 108. For this reason, unwanted infrared rays hardly enter the cold shield 104.

Since the image sensor 108 is directly attached to the cold stage 109 and is cooled to a low temperature by the stirring cooler 110, it can satisfactorily detect and photoelectrically convert images of the infrared rays X and visible light rays Y formed on its light-receiving portions. An electrical signal obtained by synthesizing the detected infrared ray image and visible light ray image is output from the output terminal of the image sensor 108 to a circuit outside the device.

Therefore, in the solid-state imaging apparatus of this embodiment, the focusing lens 101 consists of a member (e.g., ZnS) that transmits both infrared rays and visible light rays, and the variable stop 102 for adjusting the intensity of visible light rays consists of a member (e.g., Si) that transmits infrared rays but shields visible light rays, and is disposed at a position between the focusing lens 101 and the light-receiving device 107.

For this reason, by adjusting the size of the aperture portion 102A arranged at the central portion of the variable stop 102, the amount of visible light rays can be adjusted without influencing the amount of infrared rays. Hence, both an infrared ray image and visible light ray image can be simultaneously and accurately obtained.

Since the focusing lens 101 can transmit both infrared rays and visible light rays, it need not be exchanged in correspondence with an infrared ray image or a visible light ray image to be obtained, resulting in easy handling of the apparatus. On the other hand, since the variable stop 102 consists of Si or the like, which hardly absorbs ambient heat energy and the temperature of which hardly rises as compared to a member obtained by painting a metal such as Al in black, it does not radiate any infrared rays by itself without any cooling process, thus obtaining an accurate infrared ray image.

Fifth Embodiment

Figure 7:
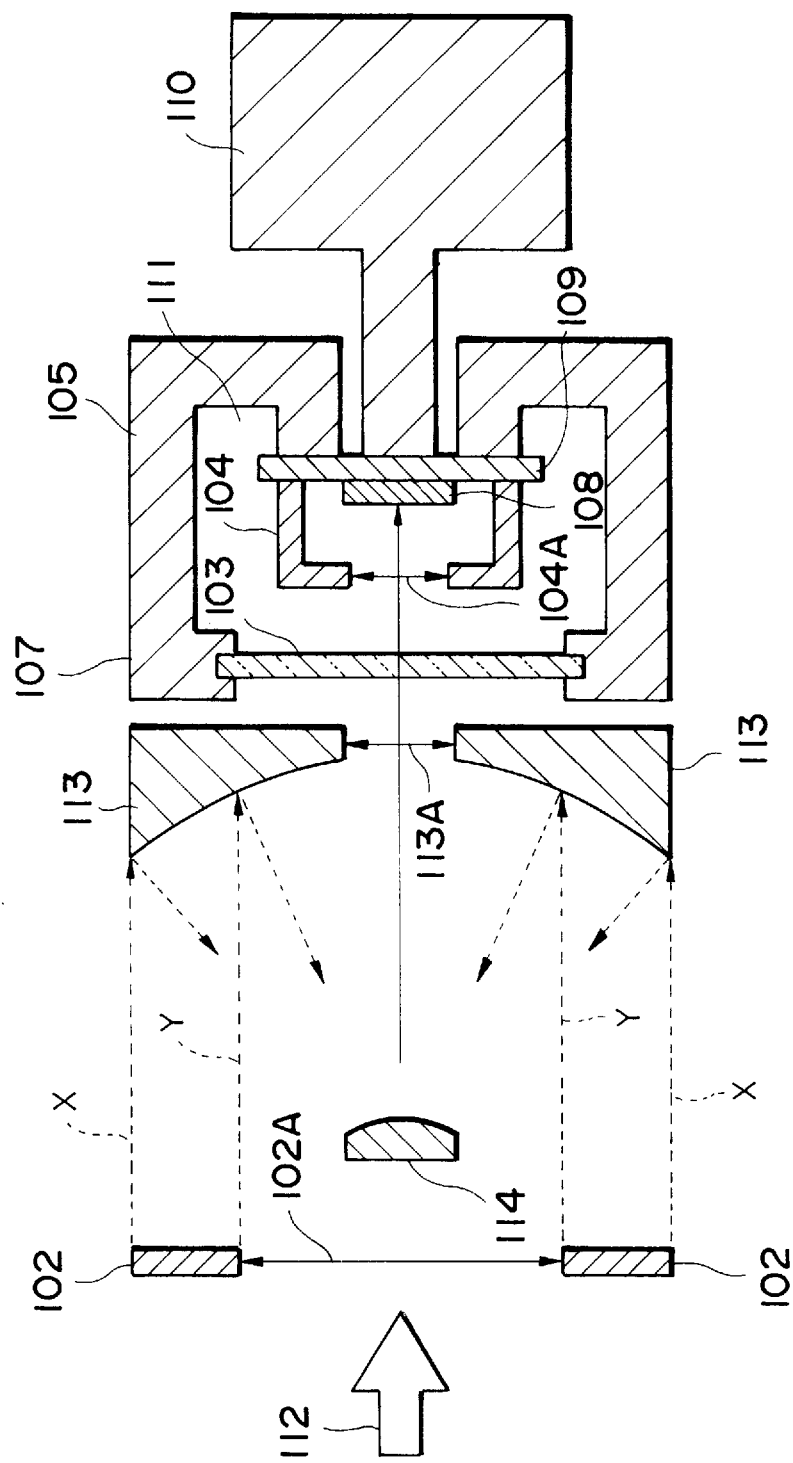
FIG. 7 is a side sectional view showing the arrangement of a solid-state imaging apparatus according to the fifth embodiment of the present invention.

A solid-state imaging apparatus of this embodiment has an arrangement, as shown in FIG. 7. This solid-state imaging apparatus has basically the same arrangement as that of the solid-state imaging apparatus of the fourth embodiment, except that two reflection mirrors (focusing optical system) 113 and 114 are arranged in front of the light-receiving device 107 in place of the focusing lens 101.

More specifically, in this solid-state imaging apparatus, the two reflection mirrors 113 and 114 for reflecting infrared rays and visible light rays are arranged between the variable stop 102 and the light-receiving device 107. The large, concave reflection mirror 113 is inserted in the optical paths of infrared rays and visible light rays that pass through the variable stop 102 so as to prevent omissions of an infrared ray image and a visible light ray image, and reflects these infrared rays and visible light rays to be focused on the reflection mirror 114.

The reflection mirror 113 has, at its central portion, a circular aperture portion 113A for guiding infrared rays and visible light rays into the light-receiving device 107. The small, convex reflection mirror 114 is arranged at a position between the variable stop 102 and the reflection mirror 113 to oppose the aperture portion 113A of the reflection mirror 113, and reflects infrared rays and visible light rays reflected and focused by the mirror 113 so they enter the light-receiving device 107 via the aperture portion 113A of the reflection mirror 113.

Note that the internal arrangement of the light-receiving device 107 is the same as that in the fourth embodiment. For this reason, the aperture portion 104A formed on the cold shield 104 limits incidence of infrared rays radiated from, e.g., the dewer 105 onto the image sensor 108 as infrared rays other than those focused by the reflection mirror 113.

The operation of the solid-state imaging apparatus of this embodiment will be explained below.

Infrared rays X included in light rays 112 coming from the left side in FIG. 7 pass through the aperture portion 102A of the variable stop 102, and are also transmitted through a portion, other than the aperture portion 102A, of the variable stop 102. The infrared rays X are then guided toward the reflection mirror 113. On the other hand, visible light rays Y included in the light rays 112 pass through the aperture portion 102A of the variable stop 102, and are guided toward the reflection mirror 113. In this case, some light components of the visible light rays Y are shielded by the portion, other than the aperture portion 102A, of the variable stop 102.

The infrared rays X and visible light rays Y transmitted through or passing through the variable stop 102 are reflected by the reflection mirror 113 and propagate toward the reflection mirror 114. More specifically, the reflection mirror 113 focuses the infrared rays X and visible light rays Y to the reflection mirror 114. The reflection mirror 114 reflects the infrared rays X and visible light rays Y reflected by the reflection mirror 113 so they pass through the aperture portion 113A formed at the central portion of the reflection mirror 113.

Note that the aperture portion 113A of the reflection mirror 113 is formed to a size large enough to pass all the infrared rays X passing through the variable aperture 102 and reflected by the reflection mirror 113. For this reason, not only the infrared rays X reflected by the reflection mirror 114 but also the visible light rays Y, the incident range of which is limited by the stop 102, pass through the aperture portion 113A of the reflection mirror 113.

The infrared rays X and visible light rays Y that pass through the aperture portion 113A of the reflection mirror 113 are transmitted through the window 103 and enter the light-receiving device 107. Thereafter, the infrared rays X and visible light rays Y pass through the aperture portion 104A of the cold shield 104 and form images on the light-receiving portions of the image sensor 108. The image sensor 108 satisfactorily detects and photoelectrically converts images of the infrared rays. X and visible light rays Y formed on its light-receiving portions. An electrical signal obtained by synthesizing the detected infrared ray image and visible light ray image is output from the output terminal of the image sensor 108 to a circuit outside the device.

Therefore, in the solid-state imaging apparatus of this embodiment, the variable stop 102 for adjusting the intensity of visible light rays consists of a member (e.g., Si) that transmits infrared rays but shields visible light rays, and the concave reflection mirror 113 and the convex reflection mirror 114 for reflecting infrared rays and visible light rays in turn are arranged at positions between the variable stop 102 and the light-receiving device 107.

For this reason, by adjusting the size of the aperture portion 102A arranged at the central portion of the variable stop 102, the amount of visible light rays can be adjusted without influencing the amount of infrared rays. Hence, both an infrared ray image and visible light ray image can be simultaneously and accurately obtained.

Sixth Embodiment

Figure 8:
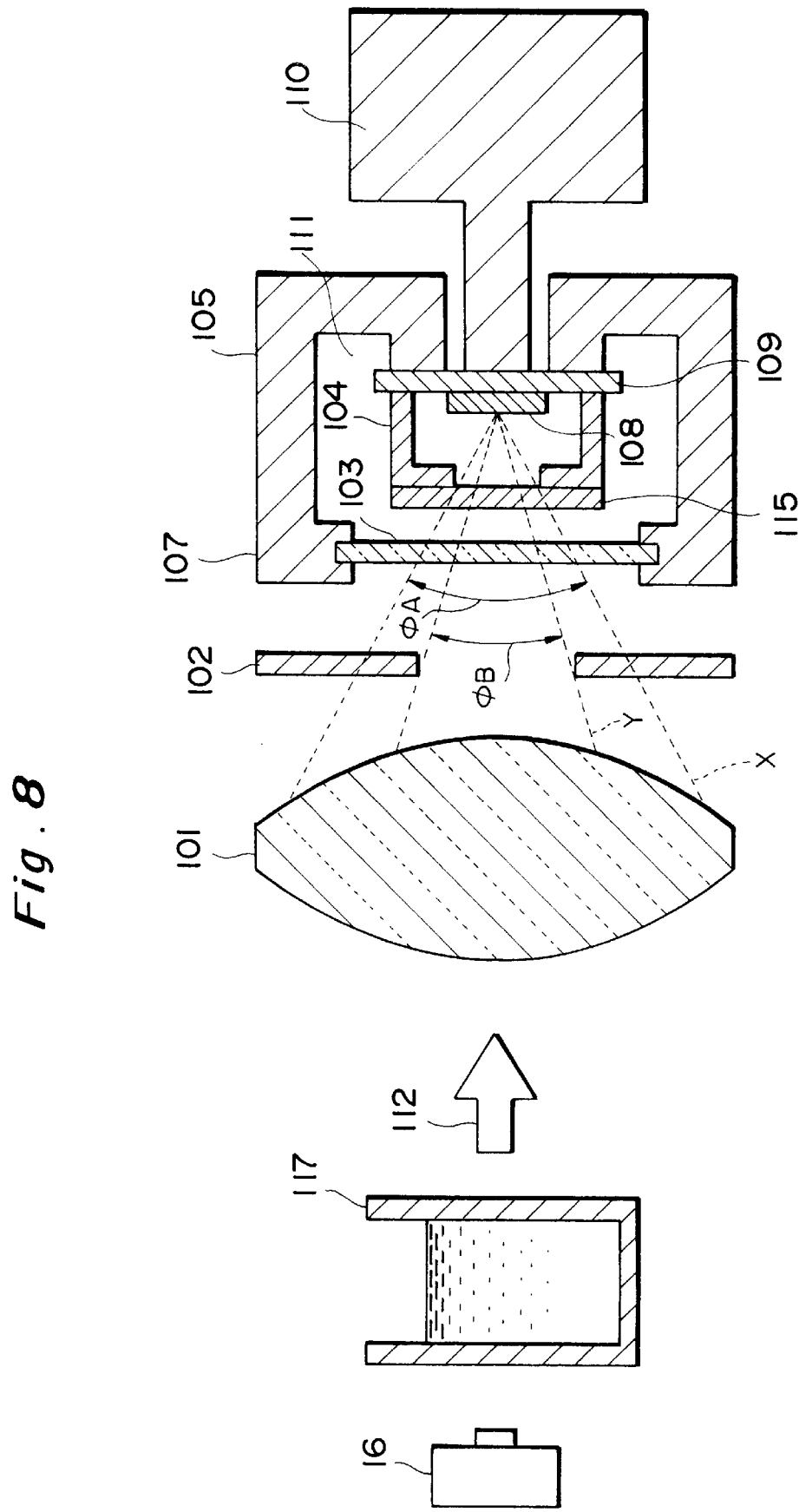
FIG. 8 is a side sectional view showing the arrangement of a solid-state imaging apparatus according to the sixth embodiment of the present invention.

A solid-state imaging apparatus of this embodiment has an arrangement, as shown in FIG. 8. This solid-state imaging apparatus has basically the same arrangement as that of the solid-state imaging apparatus of the fourth embodiment, except for the internal arrangement of the light-receiving device 107. More specifically, in this solid-state imaging apparatus, a bandpass filter (wavelength limiting mechanism) 115 is attached to cover the entire surface of the aperture portion 104A of the cold shield 104.

The bandpass filter 115 transmits infrared rays in a desired wavelength range corresponding to the light absorption characteristics of an object to be measured, and also transmits visible light rays in at least a partial wavelength region of the visible region. For example, the bandpass filter 115 may comprise a filter that has spectral characteristics for mainly transmitting infrared rays near a wavelength of 2 $\mu$m corresponding to the light absorption characteristics of water, and visible light rays in at least a partial wavelength region of the visible region.

The operation of the solid-state imaging apparatus of this embodiment will be described below.

For example, when a light source 116 is arranged on the left side in FIG. 8, i.e., in front of the focusing lens 101, and a water bath 117 containing a sufficient amount of water is arranged between the light source 116 and the focusing lens 101, i.e., on the incidence side of the focusing lens 101 of light rays 112, infrared rays near a wavelength of 2 $\mu$m of the light rays 112 irradiated from the light source 116 to the water bath 117 are absorbed by the water in the water bath 117 in correspondence with the amount of water, and visible light rays in a predetermined wavelength region are shielded by the water in the water bath 117.

For this reason, the light rays 112 which are emitted by the light source 116 and reach the focusing lens 101 via the water in the water bath 117 do not include infrared rays near the wavelength of 2 $\mu$m and visible light rays in the predetermined wavelength region. The light rays 112 focused at an angle $\phi_A$ by the focusing lens 101 are transmitted through the variable stop 102 and the window 103, and enter the light-receiving device 107 in a light beam state that does not include infrared rays near the wavelength of 2 $\mu$m and visible light rays in the predetermined wavelength region.

When the bandpass filter 115 comprises a filter having spectral characteristics for transmitting visible light rays in the predetermined wavelength region and infrared rays mainly near the wavelength of 2 μm, visible light rays in the predetermined wavelength region and infrared rays near the wavelength of 2 μm entering the light-receiving device 107 are transmitted through the bandpass filter 115, and form images on the light-receiving surface of the image sensor 108. However, of light rays that enter the light-receiving device 107 without going through the water in the water bath 117, infrared rays in a wavelength region other than that near the wavelength of 2 μm and visible light rays in a wavelength region other than the predetermined wavelength region cannot be transmitted through the bandpass filter 115.

For this reason, the image sensor 108 satisfactorily detects and photoelectrically converts images of the visible light rays and infrared rays formed on its light-receiving portions. An electrical signal obtained by synthesizing the detected infrared ray image and visible light ray image is output from the output terminal of the image sensor 108 to a circuit outside the device. As a result, the visible light image represents the reservoir water shape, and the infrared ray image represents the reservoir water amount in the water bath 117.

Therefore, when the solid-state imaging apparatus of this embodiment is used, for example, the thickness and shape of a cloud can be measured from the ground at the same time. More specifically, when the sun is assumed to be the light source 116, and clouds in air are assumed to be the water bath 117 filled with water, if light irradiated from the sun enters the clouds (water), infrared rays near the wavelength of 2 μm of the sunlight are absorbed in a light amount corresponding to the thickness of each cloud (the amount of water). On the other hand, visible light rays included in the sunlight are shielded by the clouds.

For this reason, visible light that pass through air without any clouds and infrared rays near the wavelength of 2 μm which are not absorbed in correspondence with the cloud distribution are transmitted through the bandpass filter 115 in the light-receiving device 107 and form images on the light-receiving surface of the image sensor 108. Note that infrared rays in a wavelength region other than that near the wavelength of 2 μm, which enter the light-receiving device 107, are absorbed by the bandpass filter 115.

Therefore, the image sensor 108 outputs an electrical signal obtained by synthesizing the visible light ray image and the infrared ray image detected by its light-receiving portions from the output terminal to a circuit outside the device. With this signal, the shape of each cloud can be detected based on the visible light ray image, and the thickness of each cloud can be detected based on the infrared ray image.

The present invention is not limited to the above embodiments, and various modifications may be made. For example, in the first to third embodiments, examples using only a donor impurity as the impurity of the impurity-doped silicon layer have been described. However, an acceptor impurity such as boron or the like may be used as the impurity of the impurity-doped silicon layer.

In the first to third embodiments, the feature of the present invention is applied to the photon type infrared ray detection device used in vacuo. However, the feature of the present invention may also be applied to a heat type infrared ray detection device used in vacuo.

Furthermore, in the fourth to sixth embodiments, the photon type image sensor, the light-receiving portions of which are constituted by PtSi Schottky-barrier diodes, is used as the image sensor. However, an image sensor having light-receiving portions with other structures may be used.

As has been described in detail above, in the infrared ray detection device of the present invention, the impurity-doped silicon layer which has high infrared ray absorption performance since it contains a donor or acceptor impurity at a high concentration is disposed on the other surface side of the silicon substrate. Since the refractive index of this impurity-doped silicon layer is nearly equal to that of the silicon substrate, reflection hardly occurs at the interface between the silicon substrate and the impurity-doped silicon layer, and infrared rays that enter the silicon substrate can be reliably absorbed by the impurity-doped silicon layer.

For this reason, since crosstalk that generates extraneous signals in the light-receiving portions can be prevented, image quality can be improved while suppressing deterioration of the obtained image. Since an infrared ray absorption layer is formed by the impurity-diffused silicon layer containing a donor or acceptor impurity, since no solvent or the like remains in the layer, an infrared ray detection device free from outgassing can be easily obtained.

Note that the present invention can be easily applied to an infrared ray detection device which comprises light-receiving portions formed by bringing a metal silicide film into Schottky-contact with one surface of the silicon substrate. In the infrared ray detection device of the present invention, when the impurity concentration of the impurity-doped silicon layer is set to be $5 \times 10^{20}$ cm$^{-3}$ or higher, infrared rays entering the silicon substrate can be sufficiently absorbed.

In the infrared ray detection device of the present invention, when an impurity-diffused silicon layer is formed as the impurity-doped silicon layer by diffusing a donor or acceptor impurity from the other surface of the silicon layer or when a polycrystalline silicon layer containing a donor or acceptor impurity is grown as the impurity-doped silicon layer on the other surface of the silicon substrate, the impurity-doped silicon layer can be easily and reliably formed.

Furthermore, in the infrared ray detection device of the present invention, when the impurity-doped silicon layer is constituted by an impurity-diffused silicon layer formed by diffusing a donor or acceptor impurity from the other surface of the silicon substrate and a polycrystalline silicon layer containing a donor or acceptor impurity and grown on the other surface of the silicon substrate, infrared rays entering the silicon substrate can be absorbed more reliably.

In the solid-state imaging apparatus of this embodiment, since the adjustment mechanism is arranged in front of the light detection device having detection sensitivity to infrared rays and visible light rays, the intensity of visible light rays incident on the light detection device can be adjusted. For this reason, the light detection device can simultaneously and accurately detect infrared rays and visible light rays.

Since the adjustment mechanism consists of a member that transmits infrared rays and shields visible light rays, it hardly absorbs ambient heat energy and its temperature hardly rises as compared to a member obtained by painting a metal such as Al or the like in black. For this reason, since the adjustment mechanism itself does not radiate any infrared rays without any cooling process, infrared rays can be accurately detected. When the adjustment mechanism comprises a stop that can variably set the size of an aperture portion for transmitting infrared rays and visible light rays, the intensity of visible light rays incident on the light detection device can be easily adjusted.

When the solid-state imaging apparatus of the present invention further comprises the aperture limiting mechanism which is arranged between the adjustment mechanism and the light detection device and limits incidence of infrared rays with respect to the light detection device, since the direction of incidence of infrared rays with respect to the light detection device can be limited, only desired infrared rays can be incident on the light detection device. When the aperture limiting mechanism comprises a shield which consists of a member that shields infrared rays and visible light rays and has an aperture portion for transmitting infrared rays and visible light rays, the direction of incidence of infrared rays with respect to the light detection device can be easily limited.

When the solid-state imaging apparatus of the present invention further comprises the focusing optical system for focusing infrared rays and visible light rays and guiding them toward the light detection device, images of infrared rays and visible light rays can be formed on the light-receiving surface of the light detection device. When the focusing optical system comprises a lens which is arranged in front of the adjustment mechanism and transmits and focuses infrared rays and visible light rays, or when the focusing optical system comprises a mirror which is arranged between the adjustment mechanism and the light detection device and reflects and focuses infrared rays and visible light rays, images of infrared rays and visible light rays can be easily formed on the light-receiving surface of the light detection device.

Furthermore, when the solid-state imaging apparatus of the present invention further comprises the wavelength limiting mechanism, which is arranged in front of the light detection device and transmits infrared rays in a predetermined wavelength region in the infrared region corresponding to the light absorption characteristics of an object to be measured, and visible light rays in at least a partial wavelength region in the visible region, the distribution of the object to be measured, that absorbs infrared rays in the predetermined wavelength region in the infrared region and shields visible light rays in at least the partial wavelength region in the visible region can be measured.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application Nos. 280191/1995 filed on Oct. 27, 1995 and 335275/1995 filed on Dec. 22, 1995 are hereby incorporated by reference.

What is claimed is:

1. An imaging apparatus comprising:
   an image sensor;
   a lens for directing visible light rays and infrared rays towards the image sensor; and
   a stop disposed between the image sensor and the lens and made of material that shields the visible light rays but permits transmission of the infrared rays, the stop having an adjustable aperture to control an intensity of the visible light rays that are incident on the image sensor.

2. A method of imaging a visible light ray image simultaneously with an infrared light ray image, comprising the steps of:
   directing visible light rays and infrared light rays towards an image sensor;
   shielding some of the visible light rays from being incident on the image sensor while simultaneously permitting the infrared light rays to be transmitted through the stop; and
   adjusting the shielding to control an intensity of the visible light rays that are incident on the image sensor in correspondence with brightness of ambient light.

3. A solid-state imaging apparatus comprising:
   a light detection device having detection sensitivity to both infrared light in a first wavelength region and visible light in a second wavelength region having shorter wavelengths than the first wavelength region; and
   an adjustment mechanism disposed in front of said light detection device and comprising a member that transmits the infrared light and shields the visible light, said adjustment mechanism having a variable aperture to enable adjustment of an intensity of the visible light incident on said light detection device.

4. An apparatus according to claim 3, wherein said adjustment mechanism comprises a stop which variably sets a size of an aperture portion for transmitting light components in the first and second wavelength regions.

5. An apparatus according to claim 3, further comprising an aperture limiting mechanism which is arranged between said adjustment mechanism and said light detection device and limits incidence of the light in the first wavelength region with respect to said light detection device.

6. An apparatus according to claim 5, wherein said aperture limiting mechanism comprises a shield which consists of a member for shielding light components in the first and second wavelength regions, and has an aperture portion for transmitting the light components in the first and second wavelength regions.

7. An apparatus according to claim 3, further comprising a focusing optical system for focusing light components in the first and second wavelength regions and guiding the focused light components toward said light detection device.

8. An apparatus according to claim 7, wherein said focusing optical system comprises a lens which is arranged in front of said adjustment mechanism and transmits and focuses the light components in the first and second wavelength regions.

9. An apparatus according to claim 7, wherein said focusing optical system comprises a mirror which is arranged between said adjustment mechanism and said light detection device, and reflects and focuses the light components in the first and second wavelength regions.

10. An apparatus according to claim 3, further comprising a wavelength limiting mechanism which is arranged in front of said light detection device, and transmits light in a predetermined wavelength region in the first wavelength region which is in correspondence with light absorption characteristics of an object to be measured, and light in at least a partial wavelength region in the second wavelength region.

11. An apparatus according to claim 3, wherein said light detection device comprises:
   a silicon substrate;
   a plurality of light-receiving portions which are disposed at predetermined intervals on one surface of said silicon substrate, and receive infrared rays;
   a plurality of reading portions which are disposed on the one surface of said silicon substrate at positions adjacent to said plurality of light-receiving portions, and read outputs from said plurality of light-receiving portions; and
   an impurity-doped silicon layer which are disposed in contact with the other surface opposing the one surface of said silicon substrate and contains a donor or acceptor impurity at a concentration high enough to absorb infrared rays passing through said silicon substrate.

12. An apparatus according to claim 11, wherein said plurality of light-receiving portions are constituted by a metal silicide film which is in Schottky-contact with the one surface of said silicon substrate.

13. An apparatus according to claim 11, wherein said impurity-doped silicon layer has an impurity concentration of not less than $5\times10^{20}$ cm$^{-3}$.

14. An apparatus according to claim 11, wherein said impurity-doped silicon layer comprises an impurity-diffused silicon layer formed by diffusing the donor or acceptor impurity from the other surface of said silicon substrate.

15. An apparatus according to claim 11, wherein said impurity-doped silicon layer comprises a polycrystalline silicon layer which is grown on the other surface of said silicon substrate and contains the donor or acceptor impurity.

16. An apparatus according to claim 11, wherein said impurity-doped silicon layer comprises an impurity-diffused silicon layer formed by diffusing the donor or acceptor impurity from the other surface of said silicon substrate and a polycrystalline silicon layer which is grown on the other surface of said silicon substrate and contains the donor or acceptor impurity.

* * * * *